United States Patent
Ungar

(10) Patent No.: US 7,349,453 B2
(45) Date of Patent: Mar. 25, 2008

(54) DIRECT IMPINGEMENT COOLING OF A LASER DIODE ARRAY

(75) Inventor: Jeffrey E. Ungar, Valley Village, CA (US)

(73) Assignee: Quintessence Photonics Corporation, Sylmar, CA (US)

( * ) Notice: Subject to any disclaimer, the term of this patent is extended or adjusted under 35 U.S.C. 154(b) by 0 days.

(21) Appl. No.: 11/345,107

(22) Filed: Jan. 31, 2006

(65) Prior Publication Data

US 2006/0198407 A1 Sep. 7, 2006

Related U.S. Application Data

(60) Provisional application No. 60/649,846, filed on Feb. 2, 2005.

(51) Int. Cl.
*H01S 3/04* (2006.01)
(52) U.S. Cl. ............................. 372/35; 372/34; 372/36
(58) Field of Classification Search ............ 372/34–36
See application file for complete search history.

(56) References Cited

U.S. PATENT DOCUMENTS

| | | | | | |
|---|---|---|---|---|---|
| 4,881,237 | A * | 11/1989 | Donnelly | ................. | 372/50.12 |
| 6,571,569 | B1 * | 6/2003 | Rini et al. | ................. | 62/259.2 |
| 6,880,350 | B2 * | 4/2005 | Tilton | ........................... | 62/171 |
| 6,993,926 | B2 * | 2/2006 | Rini et al. | ................. | 62/259.2 |
| 7,013,662 | B1 * | 3/2006 | Tilton et al. | ................. | 62/259.2 |
| 2001/0002541 | A1 * | 6/2001 | Patel et al. | ................ | 62/259.2 |
| 2003/0231667 | A1 * | 12/2003 | Byren et al. | .................. | 372/35 |
| 2004/0208210 | A1 * | 10/2004 | Inoguchi | ...................... | 372/36 |
| 2005/0271098 | A1 * | 12/2005 | Perry et al. | .................. | 372/35 |

\* cited by examiner

*Primary Examiner*—Minsun Oh Harvey
*Assistant Examiner*—Yuanda Zhang
(74) *Attorney, Agent, or Firm*—Ben J. Yorks; Irell & Manella LLP

(57) ABSTRACT

A laser diode array assembly. The assembly includes a plurality of vertical emitting laser diodes. Each laser diode has a vertical emitting surface and an exposed substrate surface opposite from the emitting surface. Each vertical emitting surfaces emit a laser beam. The assembly further includes one or more nozzles that directly spray a liquid onto the exposed substrate surfaces.

9 Claims, 1 Drawing Sheet

DIRECT IMPINGEMENT COOLING OF A LASER DIODE ARRAY

CROSS REFERENCE TO RELATED APPLICATIONS

This application claims priority to provisional Application No. 60/649,846, filed on Feb. 2, 2005.

BACKGROUND OF THE INVENTION

1. Field of the Invention

The subject matter disclosed generally relates to the field of semiconductor lasers.

2. Background Information

Semiconductor lasers are used in a variety of system applications. For example, semiconductor lasers are used as a light source in fiber optic communication systems. Laser diodes emit a laser beam from either the edge of the diode die or the surface of the die.

Individual diode laser sources have a finite output power. The output power of the laser source can be increased by providing an array of laser diodes. High powered laser diode arrays generate a relatively large amount of heat. For example, a 100 kW laser may generate one quarter of a megawatt of dissipated heat. The heat may affect the performance of the laser. For example, the In order to dissipate this waste heat, high power laser diode arrays are traditionally soldered to coolers constructed of a high thermal conductivity material such as Copper which incorporate channels through which a cooling fluid such as water is circulated. Multiple layers of arrays mounted on coolers are stacked closely to generate high powers. This approach to cooling has several serious shortcomings:

In order to dissipate the high heat flux generated by the array, it is necessary to circulate large volumes of fluid through small cooling channels at high velocity. This results in a high rate of cooler failure due to erosion and clogging.

Secondly, these coolers have relatively high values of thermal impedance because a finite thickness of Copper separates the array from the cooling fluid. As a result, the temperature of the diode array is much higher than that of the cooling fluid, which causes degraded performance and lifetime.

Finally, the thermal expansion coefficient of the diode differs strongly from that of the cooler to which it is soldered. This places the diode array under considerable mechanical stress, which results in premature failure of the array.

Two-phase cooling technologies, such as spray or impingement cooling, utilize the latent heat-of-vaporization of fluids such as water or ammonia to greatly reduce the fluid flow and pressure required to dissipate a given quantity of waste heat. Two-phase cooling cannot be used to directly cool conventional diode arrays, because the spray interferes with the optical output of the laser array and damages the delicate diode output facet, resulting in failure. Two-phase techniques can indirectly cool a laser array by impingement on an intermediate heat exchanger, but this increases thermal impedance and negates the performance improvement.

BRIEF SUMMARY OF THE INVENTION

A laser diode array assembly that includes an array of vertical emitting laser diodes attached to a substrate. Each laser diode has a vertical emitting surface and an exposed substrate surface. The assembly includes at least one nozzle that sprays a fluid onto the exposed substrate surfaces of the vertical emitting laser diodes.

DETAILED DESCRIPTION

Disclosed is a laser diode array assembly. The assembly includes a plurality of vertical emitting laser diodes. Each laser diode has a vertical emitting surface and an exposed surface opposite from the emitting surface. Each vertical emitting surface emits a laser beam. The assembly further includes one or more nozzles that directly spray a liquid onto the exposed surfaces. Because the light emission is on the surface facing away from the sprayed surface, the cooling mist does not interfere with the optical emission or damage the laser facet.

This arrangement has several advantages:

Firstly, the high latent heat of vaporization of fluids such as water or ammonia allows much lower fluid flows to be used to dissipate equivalent quantities of waste heat.

Secondly, there is no solid material between the cooling fluid and the laser diode array, resulting in very low thermal impedance.

Finally, because the substrate to which the laser array is attached does not lie in the thermal path, it does not need to be thermally conductive, and can be constructed from a material that is thermally expansion matched to the array, thereby eliminating mechanical stress.

Figure 1:
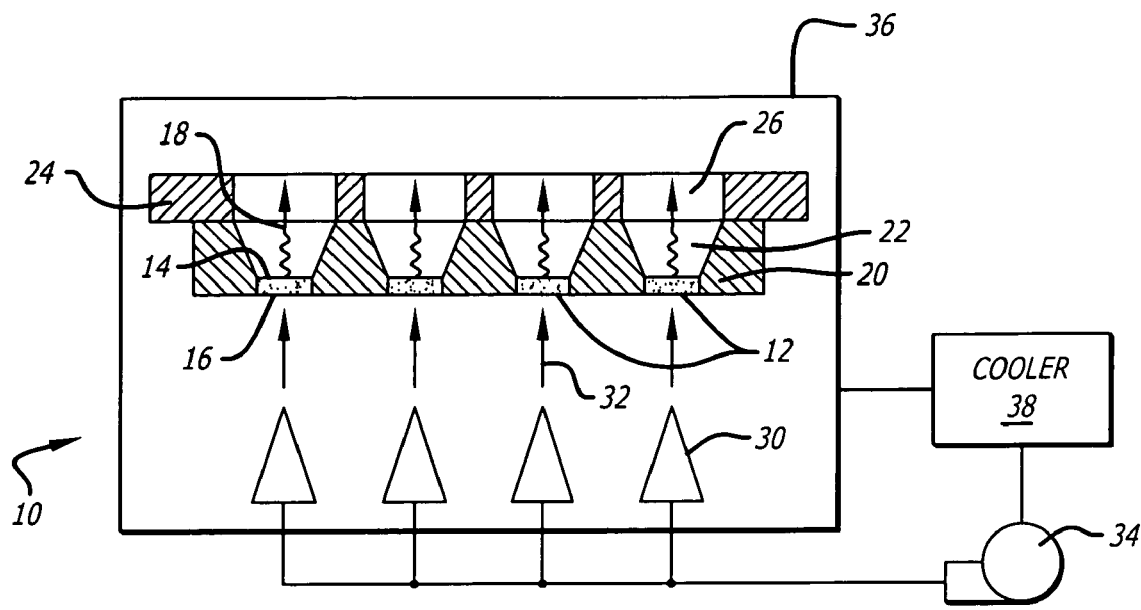
FIG. 1 is an illustration of laser diode array assembly.

Referring to the drawings more particularly by reference numbers, FIG. 1 shows a laser diode array assembly 10. The assembly 10 includes an array of vertical emitting laser diodes 12. The vertical emitting laser diodes 12 each have a vertical emitting surface 14 and an exposed surface 16. Laser beams 18 are emitted from the vertical emitting surfaces 14. The laser diodes 12 may be constructed as vertical cavity surface emitting lasers ("VCSELs"), horizontal diodes with deflection mirrors, or any other type of vertical emitting laser diode.

The laser diodes 12 may be fabricated on a substrate 20 with known semiconductor fabrication techniques. The substrate 20 may have a plurality of apertures 22 that allow the laser beams 18 to travel therethrough. The apertures 22 can be formed by etching, drilling or other processes. The substrate 20 may be attached to a mounting fixture 24. The mounting fixture 24 may also have apertures or transparent windows 26 to allow for the transmission of the laser beams 18 out of the assembly 10. Although not shown, these apertures may incorporate optics such as beam shaping lenses if desired.

The assembly 10 may include a plurality of nozzles 30. The nozzles 30 each direct a fluid spray 32 onto the exposed substrate surfaces 16 of the laser diodes 12. The nozzles 30 may spray a liquid such as water onto the exposed surfaces 16. Some or all of the water may transform into a gaseous phase, wherein the latent heat of vaporization absorbs thermal energy generated and emitted by the laser diodes 12. The liquid spray directly impinges onto the exposed substrate surfaces 16, providing for direct heat transfer between the laser diodes 12 and the liquid. Although water is described, it is to be understood that other types of fluids, including liquid and/or gas mixtures may be sprayed onto the substrate surfaces 16. For example, Freon may be sprayed onto the surfaces 16.

The nozzles 30 may be connected to a pump 34. The assembly 10 may be located within a chamber 36 that collects the heated liquid/gas spray. The chamber 36 may be connected to a condenser/cooler 38 that cools and condenses the gas. The condenser/cooler 38 may be coupled to the pump 34 to create a closed loop system.

Figure 2:
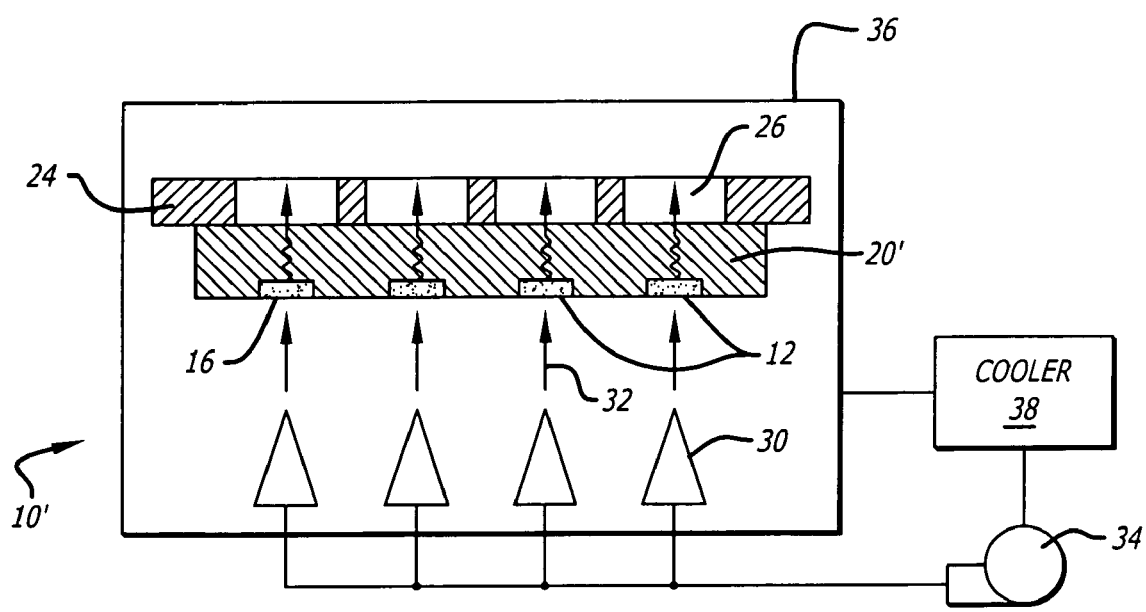
FIG. 2 is an illustration showing an alternate embodiment of the laser diode array assembly.

FIG. 2 shows an alternate embodiment of a assembly 10'. In this embodiment the substrate 20' is constructed from a material that is transparent to the laser beams 18. Being transparent, the substrate does not require the apertures 22 of the embodiment shown in FIG. 1.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A laser diode array assembly, comprising:
   an array of vertical emitting laser diodes coupled to a substrate, said vertical emitting laser diodes each having a vertical emitting surface and an exposed substrate surface;
   at least one nozzle that sprays a fluid onto said exposed substrate surfaces; and,
   a mounting fixture attached to said array of vertical emitting laser diodes in a manner that allows laser beams to be emitted from said vertical emitting surfaces and said fluid to be sprayed directly on said exposed substrate surfaces of said vertical emitting laser diodes.

2. The assembly of claim 1, further comprising a mounting fixture attached to said substrate.

3. The assembly of claim 1, wherein said substrate has a plurality of apertures.

4. The assembly of claim 1, wherein said nozzle emits a liquid spray.

5. The assembly of claim 1, wherein said substrate is transparent to a plurality of beams of light emitted by said vertical emitting laser diodes.

6. A method for operating an array of laser diodes, comprising:
   generating a plurality of laser beams from a plurality of vertical emitting surfaces of a plurality of vertical emitting laser diodes, the vertical emitting laser diodes each having an exposed substrate surface and a mounting fixture is attached to the array of vertically emitting laser diodes in a manner that allows laser beams to be emitted from said vertical emitting surfaces and said fluid to be sprayed directly on said exposed substrate surfaces of said vertical emitting laser diodes,
   spraying the exposed substrate surfaces with a fluid spray.

7. The method of claim 6, wherein the fluid spray is a liquid spray.

8. The method of claim 6, wherein the laser beams travel through apertures in a substrate of the vertical emitting laser diodes.

9. The method of claim 6, wherein the laser beams travel through a transparent substrate of the vertical emitting laser diodes.

* * * * *